(12) United States Patent
Kim et al.

(10) Patent No.: US 10,833,046 B2
(45) Date of Patent: Nov. 10, 2020

(54) STACK TOOL FOR REFLOW AND STACK APPARATUS HAVING THE SAME

(71) Applicant: Samsung Electronics Co., Ltd., Suwon-si, Gyeonggi-do (KR)

(72) Inventors: Tea Geon Kim, Hwasung-si (KR); Jung Lae Jung, Hwasung-si (KR); Bub Ryong Lee, Hwasung-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 167 days.

(21) Appl. No.: 16/058,227

(22) Filed: Aug. 8, 2018

(65) Prior Publication Data

US 2019/0252343 A1    Aug. 15, 2019

(30) Foreign Application Priority Data

Feb. 13, 2018 (KR) .................. 10-2018-0017840

(51) Int. Cl.
*B23K 37/04* (2006.01)
*H01L 23/00* (2006.01)

(52) U.S. Cl.
CPC .......... *H01L 24/75* (2013.01); *B23K 37/0408* (2013.01); *B23K 37/0435* (2013.01);
(Continued)

(58) Field of Classification Search
CPC ............... H01L 24/75; H01L 2224/753; H01L 2224/75502; H01L 2224/75272;
(Continued)

(56) References Cited

U.S. PATENT DOCUMENTS 4,371,912 A * 2/1983 Guzik .................. H05K 3/3415
361/679.31
4,759,491 A * 7/1988 Fisher ...................... B23K 3/06
118/225
(Continued)

FOREIGN PATENT DOCUMENTS

JP    2007019436 A    1/2007
JP    2008147218 A    6/2008
(Continued)

*Primary Examiner* — Kiley S Stoner
(74) *Attorney, Agent, or Firm* — Harness, Dickey & Pierce, P.L.C.

(57) ABSTRACT

A stack tool comprises a lower jig having a plurality of package seating regions configured to seat a semiconductor package, an intermediate jig configured to be seated on top of the lower jig, and having a package support hole into which the semiconductor package is configured to be inserted, the intermediate jig having a shape corresponding to the plurality of package seating regions, and an upper dumbbell. The upper dumbbell includes a dumbbell main body on top of the intermediate jig, an upper recess stepped downward from an upper surface of the dumbbell main body on only a region corresponding to an upper surface of the semiconductor package, and a protruding support configured to protrude downward from a lower surface of the upper recess and configured to be brought into contact with an upper surface of the semiconductor package.

20 Claims, 7 Drawing Sheets

(52) U.S. Cl.
CPC .... B23K 37/0443 (2013.01); *H01L 2224/753* (2013.01); *H01L 2224/75251* (2013.01); *H01L 2224/75272* (2013.01); *H01L 2224/75502* (2013.01)

(58) Field of Classification Search
CPC ........... H01L 2224/75251; H01L 25/50; H01L 25/105; H01L 2225/1058; H01L 2225/1041; H01L 2225/1023; H01L 2924/15331; H01L 2924/15311; H01L 2224/48227; H01L 2224/16227; H01L 24/48; H01L 24/16; H01L 2224/8121; H01L 2224/75982; H01L 2224/75621; H01L 2224/7555; H01L 24/81; B23K 1/0016; B23K 2101/36–42; B23K 37/04; B23K 37/0408; B23K 37/0426–0443
USPC ...... 228/179.1–180.22, 212–213, 44.3, 44.7, 228/47.1, 49.1, 49.5
See application file for complete search history.

(56) References Cited

U.S. PATENT DOCUMENTS

| | | | | |
|---|---|---|---|---|
| 4,804,130 A * | 2/1989 | Kwan | ................... | B23K 3/087 228/44.7 |
| 5,332,463 A * | 7/1994 | Eberlein | ............. | B32B 38/1833 156/299 |
| 5,454,159 A * | 10/1995 | Norell | ................. | H01L 21/4853 174/266 |
| 5,667,128 A * | 9/1997 | Rohde | ............... | H01L 21/67144 228/49.5 |
| 5,701,233 A * | 12/1997 | Carson | ................ | H01L 25/0652 361/735 |
| 5,964,396 A * | 10/1999 | Brofman | .............. | B23K 3/0638 228/180.22 |
| 5,984,165 A * | 11/1999 | Inoue | ................... | B23K 1/0056 219/209 |
| 6,003,757 A * | 12/1999 | Beaumont | ............ | B23K 3/0623 228/246 |
| 6,213,376 B1 * | 4/2001 | Correia | ............... | B23K 37/0408 228/212 |
| 6,267,288 B1 * | 7/2001 | Chung | ..................... | B23K 3/08 228/44.7 |
| 7,614,538 B2 * | 11/2009 | Gillotti | ................ | B23K 20/004 228/4.5 |
| 7,845,539 B1 * | 12/2010 | Kim | ..................... | B23K 3/0623 228/39 |
| 7,882,997 B2 * | 2/2011 | Zakel | ...................... | H01L 24/26 228/44.7 |
| 8,186,041 B1 * | 5/2012 | Walker | ................. | H01R 43/205 219/85.18 |
| 8,317,077 B2 * | 11/2012 | Hwang | ................ | B23K 1/0012 228/39 |
| 8,752,751 B2 * | 6/2014 | Chuang | .................. | H01L 24/78 228/4.5 |
| 8,759,158 B2 | 6/2014 | Takahashi | | |
| 9,015,930 B2 | 4/2015 | Maeda et al. | | |
| 9,016,342 B2 | 4/2015 | Kobayashi | | |
| 9,629,259 B1 * | 4/2017 | Hart | ..................... | B23K 1/0016 |
| 2003/0235636 A1 * | 12/2003 | Tsai | ................... | B29C 45/14655 425/116 |
| 2006/0186576 A1 * | 8/2006 | Takase | .................... | B29C 33/68 264/272.11 |
| 2008/0153201 A1 * | 6/2008 | Uemura | ................ | H01L 21/563 438/106 |
| 2012/0280404 A1 | 11/2012 | Kwon et al. | | |
| 2013/0181040 A1 * | 7/2013 | Watanabe | ........... | H01L 21/4814 228/211 |
| 2014/0239488 A1 | 8/2014 | Kobayashi et al. | | |
| 2016/0358836 A1 * | 12/2016 | Colgan | .................. | H01L 23/473 |

FOREIGN PATENT DOCUMENTS

| | | | | |
|---|---|---|---|---|
| JP | | 2013232472 A * | 11/2013 | ............. H01L 24/75 |
| WO | WO-2016136021 A1 * | | 9/2016 | ............. H01L 23/00 |

* cited by examiner

STACK TOOL FOR REFLOW AND STACK APPARATUS HAVING THE SAME

CROSS-REFERENCE TO RELATED APPLICATION

This U.S. non-provisional patent application claims priority under 35 U.S.C. § 119 to and the benefit of Korean Patent Application No. 10-2018-0017840, filed on Feb. 13, 2018, in the Korean Intellectual Property Office (KIPO), the disclosure of which is incorporated herein by reference in its entirety.

BACKGROUND

Inventive concepts relate to a stack tool for reflow of a semiconductor package and a reflow apparatus including the stack tool.

A semiconductor package is formed by stacking at least one semiconductor chip and a package substrate. The semiconductor package may be formed by bonding semiconductor chips to lower and upper portions of the package substrate. The package substrate may be formed by bonding a solder bump or a solder ball to a substrate main body such as a printed circuit board (PCB) substrate. The semiconductor chip and the package substrate are bonded to each other through a reflow process.

The reflow process is a process in which heat is applied to the semiconductor package, with a pad of the semiconductor chip being in contact with the solder bump of the package substrate. Thus the solder bump is melted and bonded to the pad. The reflow process may be performed by seating the semiconductor chip and the package substrate on top of a lower jig, placing a dumbbell on an upper portion of the package substrate, and applying heat.

The dumbbell acts to pressurize the package substrate so that the package substrate makes acceptable, or good, contact with the semiconductor chip during the applying of the heat. The dumbbell is separated from the package substrate after the applying of the heat is completed. The dumbbell should be separated in a state in which the package substrate has been sufficiently cooled. When the package substrate has not been sufficiently cooled, the package substrate and the semiconductor chip may become partially separated, and/or deformation of the package substrate may be caused in the process of separating the dumbbell, such that reliability of the semiconductor package may be degraded. Further, when time is spent for sufficiently cooling the dumbbell, time required for the reflow process may increase, and thus subsequent processes may be delayed.

SUMMARY

Inventive concepts are directed to providing a stack tool for reflow, which improves reliability of a semiconductor package, and a reflow apparatus including the stack tool.

A stack tool for reflow according to some example embodiments of inventive concepts includes a lower jig having a plurality of package seating regions configured to seat a semiconductor package, an intermediate jig configured to be seated on top of the lower jig, and having a package support hole into which the semiconductor package is configured to be inserted, the intermediate jig having a shape corresponding to the plurality of package seating regions, and an upper dumbbell. The upper dumbbell includes a dumbbell main body on top of the intermediate jig, an upper recess stepped downward from an upper surface of the dumbbell main body on only a region corresponding to an upper surface of the semiconductor package, and a protruding support configured to protrude downward from a lower surface of the upper recess and configured to be brought into contact with an upper surface of the semiconductor package.

A stack tool for reflow according to some example embodiments of inventive concepts includes a lower jig having a plurality of package seating regions configured to seat a semiconductor package, an intermediate jig in a shape corresponding to each of the plurality of package seating regions, and having a package support hole configured to support the semiconductor package, and an upper dumbbell on top of the intermediate jig. The upper dumbbell includes a dumbbell main body, the dumbbell main body having a first region corresponding to an upper surface of the semiconductor package, the first region having a volume less than each of the plurality of package seating regions.

A reflow apparatus according to some example embodiments of inventive concepts includes the above-described stack tool, a process chamber having a tool inlet at one side of the process chamber and a tool outlet at another side of the process chamber, the process chamber configured to provide a space for performing a reflow process on the stack tool, and a transfer part configured to transfer the stack tool into the process chamber through the tool inlet and transfer the stack tool out of the process chamber through the tool outlet.

BRIEF DESCRIPTION OF THE DRAWINGS

FIG. 8 is a vertical cross-sectional view, corresponding to FIG. 7, of an upper dumbbell of a stack tool according to some example embodiments of inventive concepts, which;

DETAILED DESCRIPTION OF EXAMPLE EMBODIMENTS

Hereinafter, a stack tool for reflow according to some example embodiments of inventive concepts and a reflow apparatus including the stack tool will be described.

First, a reflow process of a semiconductor package in which a stack tool according to some example embodiments of inventive concepts are used will be described.

Figure 1A:
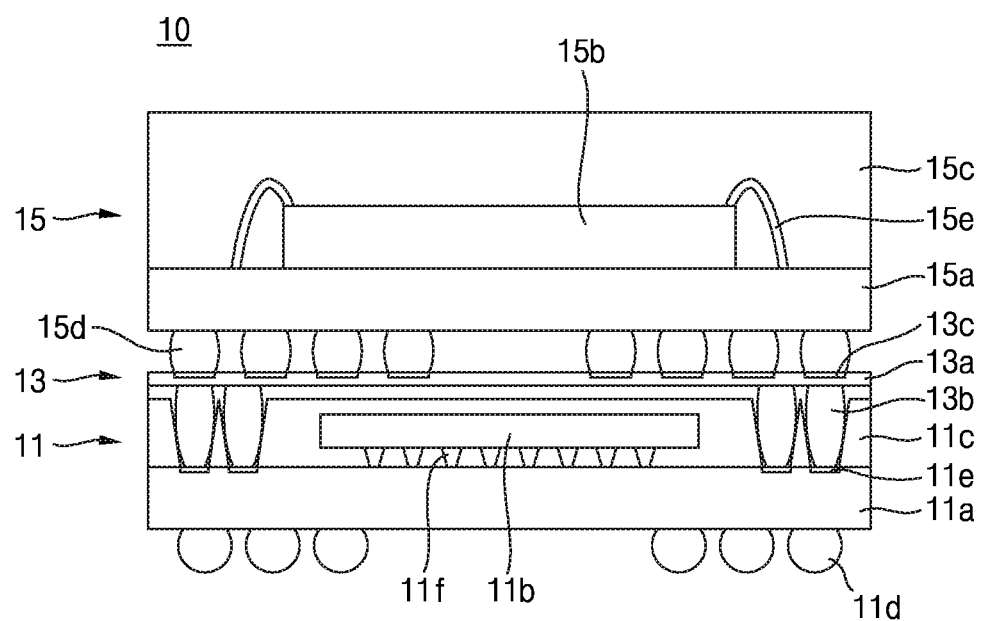
FIG. 1A is a vertical cross-sectional view of a semiconductor package manufactured using a stack tool for reflow according to some example embodiments of inventive concepts.
Figure 1B:
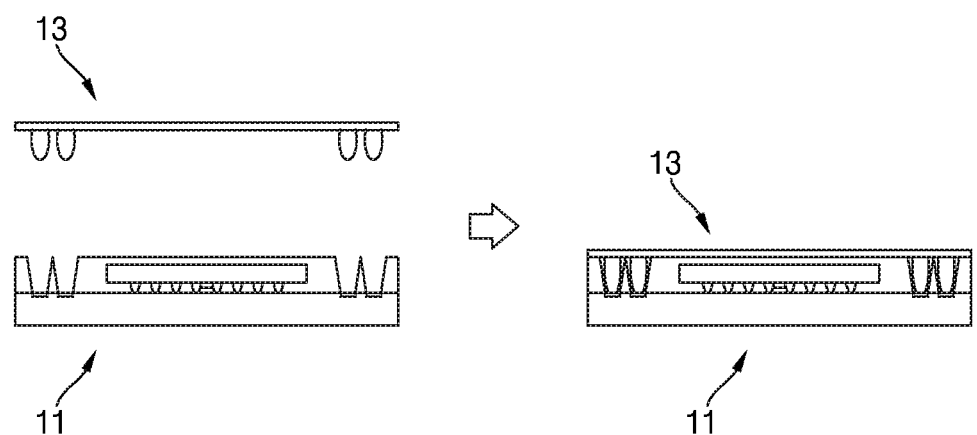
FIG. 1B is a schematic diagram illustrating a reflow process of a lower semiconductor chip and a package substrate of FIG. 1A.

FIG. 1A is a vertical cross-sectional view of a semiconductor package manufactured using a stack tool for reflow according to some example embodiments of inventive concepts. FIG. 1B is a schematic diagram illustrating a reflow process of a lower semiconductor chip and a package substrate of FIG. 1A.

Referring to FIG. 1A, a semiconductor package 10 includes a lower semiconductor package 11 and an intermediate package substrate 13. The semiconductor package 10 may include an upper semiconductor package 15. The lower semiconductor package 11 may include a lower package substrate 11a, a lower semiconductor chip 11b, and a lower mold 11c. The lower package substrate 11a may include a lower ball 11d bonded to a lower surface thereof and a lower pad 11e formed on an upper surface of the lower package substrate 11a and exposed through the lower mold 11c. The lower semiconductor chip 11b may be bonded to a lower semiconductor substrate through a separate connecting ball 11f. The intermediate package substrate 13 may include an intermediate bump 13b bonded to a lower surface of a substrate main body 13a and an intermediate pad 13c formed on an upper surface of the substrate main body 13a. The intermediate package substrate 13 may be or include an interposer PCB. The upper semiconductor package 15 may include an upper package substrate 15a, an upper semiconductor chip 15b, and an upper mold 15c. The upper package substrate 15a may have an upper ball 15d bonded to a lower surface thereof. The upper semiconductor chip 15b may be bonded to the upper package substrate 15a through a separate bonding wire 15e. The intermediate package substrate 13 is stacked on the lower semiconductor package 11 such that the intermediate bump 13b is brought into contact with the lower pad 11e of the lower package substrate 11a.

Referring to FIG. 1B, the reflow process includes process of soldering the intermediate bump 13b of the intermediate package substrate 13 to the lower pad 11e of the lower package substrate 11a. The reflow process includes process of spraying air, which is heated at a temperature of about 250° C., to the lower semiconductor package 11 and the intermediate package substrate 13 which are vertically stacked, melting the intermediate bump 13b, and soldering the intermediate bump 13b to the lower pad 11e. The reflow process is performed while the lower semiconductor package 11 and the intermediate package substrate 13, which are vertically stacked, are mounted on a stack tool and are moved. Meanwhile, the reflow process includes process which is generally performed in the process of manufacturing the semiconductor package 10, and the reflow process may be applied to semiconductor packages having various structures. Therefore, the reflow process may be applied to semiconductor packages having various structures in addition to the semiconductor package 10 shown in FIGS. 1A and 1B. The upper semiconductor package 15 is stacked on top of the intermediate package substrate 13 such that the upper ball 15d is brought into contact with the intermediate pad 13c of the intermediate package substrate 13. The upper ball 15d of the upper semiconductor package 15 is soldered to the intermediate pad 13c of the intermediate package substrate 13 through the reflow process.

The stack tool for reflow according to some example embodiments of inventive concepts will be described below.

Figure 2:
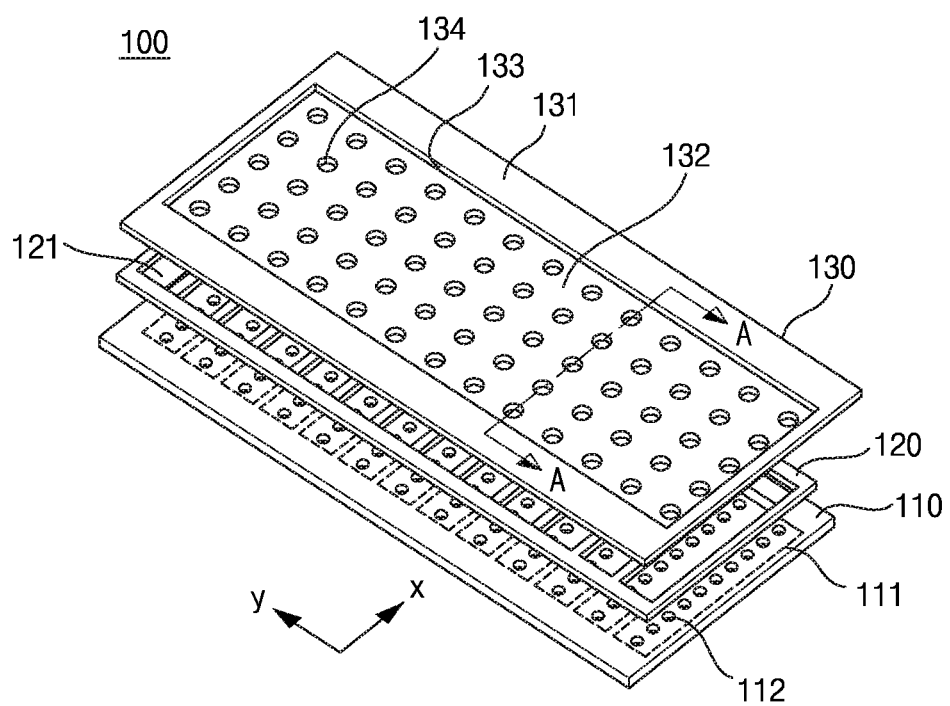
FIG. 2 is an exploded perspective view of the stack tool for reflow according to some example embodiments of inventive concepts.
Figure 3:
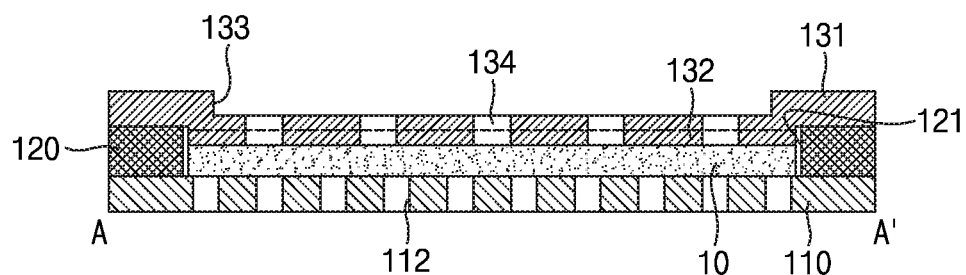
FIG. 3 is a vertical cross-sectional view taken along the line A-A of FIG. 2.
Figure 4:
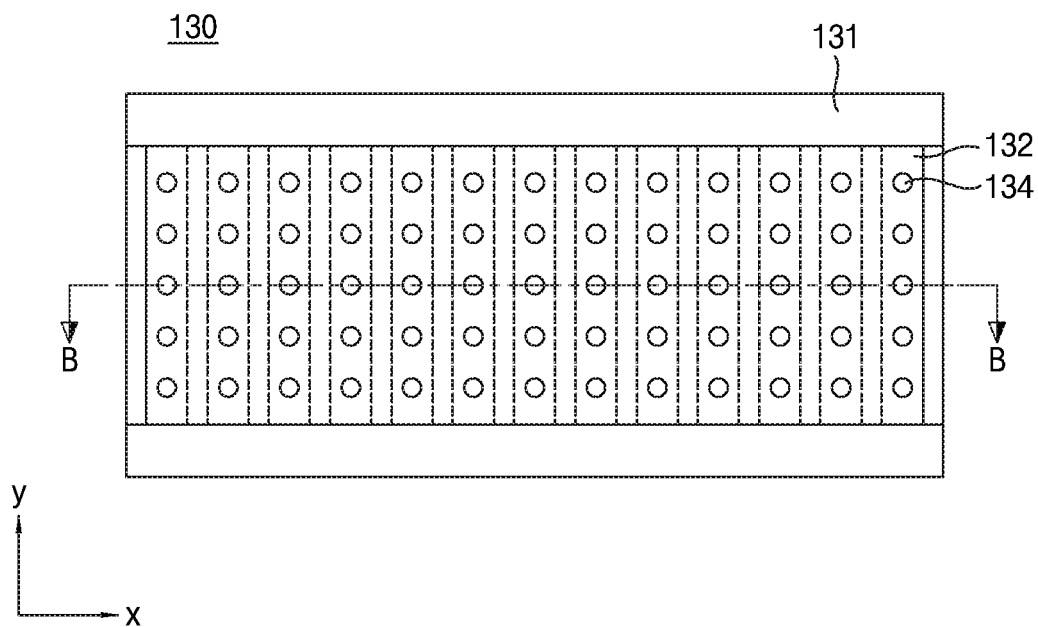
FIG. 4 is a bottom view of an upper dumbbell of FIG. 2.
Figure 5:
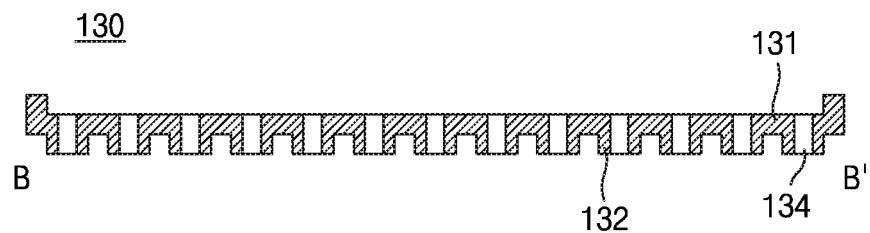
FIG. 5 is a vertical cross-sectional view taken along the line B-B of FIG. 4.

FIG. 2 is an exploded perspective view of the stack tool for reflow according to some example embodiments of inventive concepts. FIG. 3 is a vertical cross-sectional view taken along the line A-A of FIG. 2. FIG. 4 is a bottom view of an upper dumbbell of FIG. 2. FIG. 5 is a vertical cross-sectional view taken along the line B-B of FIG. 4.

FIG. 2 shows a state in which the semiconductor package 10 is omitted and FIG. 4 shows a state in which the semiconductor package 10 is seated. In FIG. 4, a single semiconductor package 10 or a plurality of semiconductor packages 10 may be provided. Hereinafter, a state in which the lower semiconductor package 11 and the intermediate package substrate 13 are combined is referred to as a semiconductor package.

Referring to FIGS. 2 to 5, a stack tool 100 for reflow according to some example embodiments of inventive concepts may be formed to include a lower jig 110, an intermediate jig 120, and an upper dumbbell 130. The stack tool 100 includes a space for accommodating the semiconductor package 10, which is formed by sequentially stacking, from a lower side, the lower jig 110, the intermediate jig 120, and the upper dumbbell 130. The stack tool 100 seats the semiconductor package 10 on top of the lower jig 110, supports a side portion of the semiconductor package 10 with the intermediate jig 120, and pressurizes a top of the semiconductor package 10 with the upper dumbbell 130. During the reflow process, the lower jig 110 and the intermediate jig 120 may maintain a bonded state between the lower semiconductor package 11 and the intermediate package substrate 13. The upper dumbbell 130 may pressurize an upper surface of the intermediate package substrate 13 using a weight of the upper dumbbell 130 to maintain a contact state between the lower semiconductor package 11 and the intermediate package substrate 13.

The lower jig 110 may include a package seating region 111. The lower jig 110 may further include a lower through-hole 112. The lower jig 110 may be formed in a substantially plate shape having a desired (or, alternatively, predetermined) thickness. The lower jig 110 may be made of a material such as a stainless steel having heat resistance and corrosion resistance. The lower jig 110 may seat the semiconductor package 10 on an upper surface of the lower jig 110 to support the semiconductor package 10.

The package seating region 111 may be formed to have an appropriate area according to a horizontal area of the semiconductor package 10 and the number thereof on which the reflow process will be performed. The package seating region 111 may be formed in a rectangular shape having a longer length in a first direction x. A plurality of package seating regions 111 may be formed and spaced apart from each other in a second direction y perpendicular to the first direction x. The package seating region 111 may seat the semiconductor package 10, on which the reflow process is performed, on an upper surface of the package seating region 111 to support the semiconductor package 10.

The lower through-hole 112 is formed in a hole shape passing through from an upper surface of the package seating region 111 to a lower surface thereof. A plurality of lower through-holes 112 may be formed and spaced apart from each other in the first direction x. The lower through-hole 112 allows externally supplied heated air to be supplied to a lower surface of the lower semiconductor package 11 during the reflow process.

The intermediate jig 120 may include a package support hole 121. The intermediate jig 120 may be formed in a substantially plate shape corresponding to a flat-surface shape of the lower jig 110. The intermediate jig 120 may be made of a material such as a stainless steel having heat resistance and corrosion resistance. The intermediate jig 120 may be seated on top of the lower jig 110 to support the side portion of the semiconductor package 10.

The package support hole 121 is formed to pass through from an upper surface of the intermediate jig 120 and a lower surface thereof. The package support hole 121 is formed in a shape corresponding to a flat-surface shape of the package seating region 111. When the intermediate jig 120 is seated on top of the lower jig 110, the package support hole 121 may be formed at a position corresponding to a formation position of the package seating region 111. A plurality of package support holes 121 may be formed corresponding to the plurality of package seating regions 111 and may be spaced apart from each other in the second direction y. The package support hole 121 may support the side portion of the semiconductor package 10, which will be inserted into the package support hole 121, to prevent, or reduce the likelihood of occurrence of, movement of the semiconductor package 10 in the reflow process.

The upper dumbbell 130 may include a dumbbell main body 131, a protruding support 132, an upper recess 133, and an upper through-hole 134. The upper dumbbell 130 may come into contact with a top of the intermediate package substrate 13 while being seated on top of the intermediate jig 120, and thus may pressurize the intermediate package substrate 13 with a weight of the upper dumbbell 130 to maintain a contact state between the intermediate package substrate 13 and the lower semiconductor package 11. The upper dumbbell 130 may be made of a material such as a stainless steel having heat resistance and corrosion resistance. The dumbbell main body 131 and the protruding support 132 may be integrally formed. The dumbbell main body 131 and the protruding support 132 may be formed such that a single block is processed.

The upper dumbbell 130 may be heated by heated air to supply heat required or used for reflow to the intermediate package substrate 13. The upper dumbbell 130 may make the heated air directly come into contact with the semiconductor package 10 to heat the semiconductor package 10. After the reflow process is completed, the upper dumbbell 130 may be separated from the intermediate package substrate 13. The dumbbell main body 131 of the upper dumbbell 130 may be formed such that a region corresponding to the upper surface of the semiconductor package 10 is reduced in volume in comparison with other regions. More specifically, the upper recess 133 may be formed in only a region corresponding to the upper surface of the semiconductor package 10 in the dumbbell main body 131 of the upper dumbbell 130. The dumbbell main body 131 of the upper dumbbell 130 may be reduced in thickness in only a region corresponding to a region in contact with the intermediate package substrate 13. The dumbbell main body 131 of the upper dumbbell 130 may be reduced in volume in only a region positioned on an upper portion of the intermediate package substrate 13. Thus, the upper dumbbell 130 may be rapidly cooled in a region in contact with the semiconductor package 10 while maintaining overall strength so that the intermediate package substrate 13 is further rapidly cooled.

The dumbbell main body 131 may be formed in a plate shape having a desired (or, alternatively, predetermined) thickness. The dumbbell main body 131 may be formed such that a region corresponding to the upper surface of the semiconductor package 10 has a relatively smaller thickness than other regions. The dumbbell main body 131 may be formed such that the region corresponding to the upper surface of the semiconductor package 10 has a smaller volume than other regions. The dumbbell main body 131 may be formed in a flat-surface shape corresponding to a flat-surface shape of the lower jig 110 or the intermediate jig 120. The dumbbell main body 131 may pressurize the intermediate package substrate 13 with a weight of the dumbbell main body 131 and with the protruding support 132.

The protruding support 132 is formed in a block shape protruding downward from a lower surface of the dumbbell main body 131. The protruding support 132 may be formed in a flat-surface shape corresponding to a flat-surface shape of the package support hole 121 of the intermediate jig 120. The number of the protruding supports 132 may correspond to the number of the package support holes 121. Similar to the plurality of package support holes 121, the plurality of protruding supports 132 may be formed and spaced apart in the second direction y. The protruding support 132 may be inserted into the package support hole 121 of the intermediate jig 120 and may be brought into contact with the upper surface of the intermediate package substrate 13. The protruding support 132 may pressurize the upper surface of the intermediate package substrate 13 with a weight of the protruding support 132 to maintain a state in which the intermediate package substrate 13 is in contact with the lower semiconductor package 11 during the reflow process.

The upper recess 133 may be formed in a recess shape stepped downward from an upper surface of the dumbbell main body 131. The upper recess 133 may be formed in a recess shape having a flat bottom surface. The upper recess 133 may be formed to have a depth that is less than a thickness of the dumbbell main body 131. The upper recess 133 may be formed in the downward direction in only a region corresponding to the upper surface of the semiconductor package 10 on the upper surface of the dumbbell main body 131. The upper recess 133 is formed in only a region positioned at the top of the semiconductor package 10 in the dumbbell main body 131. The upper recess 133 may reduce a thickness or a volume of the dumbbell main body 131 in the region positioned at the top of the semiconductor package 10 relative to the other regions. Meanwhile, the upper recess 133 may be formed to extend to a region in which the protruding support 132 is formed in the dumbbell main body 131. The upper recess 133 may be integrally formed. For example, a single upper recess 133 may be formed. The upper recess 133 may reduce a volume of the dumbbell main body 131 to increase a cooling rate of the upper dumbbell 130. Thus, the upper dumbbell 130 may be rapidly cooled to rapidly cool the semiconductor package 10. Further, the upper recess 133 may increase a heat dissipation area of the upper surface of the dumbbell main body 131 to increase the cooling rate of the upper dumbbell 130.

The upper through-hole 134 may be formed in a hole shape passing through from the bottom surface of the upper recess 133 to a lower surface of the protruding support 132. The upper through-hole 134 may be formed in a region in which the protruding support 132 is formed. A plurality of upper through-holes 134 may be formed and spaced apart from each other on the protruding support 132 along the first direction x. Further, similar to the protruding support 132, the plurality of upper through-holes 134 may be formed and spaced apart from each other in the second direction y. The plurality of upper through-holes 134 may be disposed in the form of a grid on the upper recess 133. The upper through-hole 134 provides a path through which the heated air supplied to the top of the stack tool 100 flows to the upper surface of the intermediate package substrate 13.

Although not shown in detail in the drawings, the upper through-hole 134 may be formed in a shape in which a horizontal cross-sectional area increases in an upward direction, i.e. in the shape of an upside-down frustum. When the upper through-hole 134 has a cylindrical shape, the upper through-hole 134 may be formed in a shape of which a diameter increases in the upward direction. When an upper portion of the upper through-hole 134 has a larger horizontal cross-sectional area than a lower portion thereof, internal heat may be more efficiently dissipated during a cooling process of the stack tool 100. Further, a gas supplied to the upper portion of the upper dumbbell 130 may more efficiently pass through the upper through-hole 134 to come into contact with an upper surface of a semiconductor substrate.

A stack tool according to some example embodiments of inventive concepts will be described below.

Figure 6:
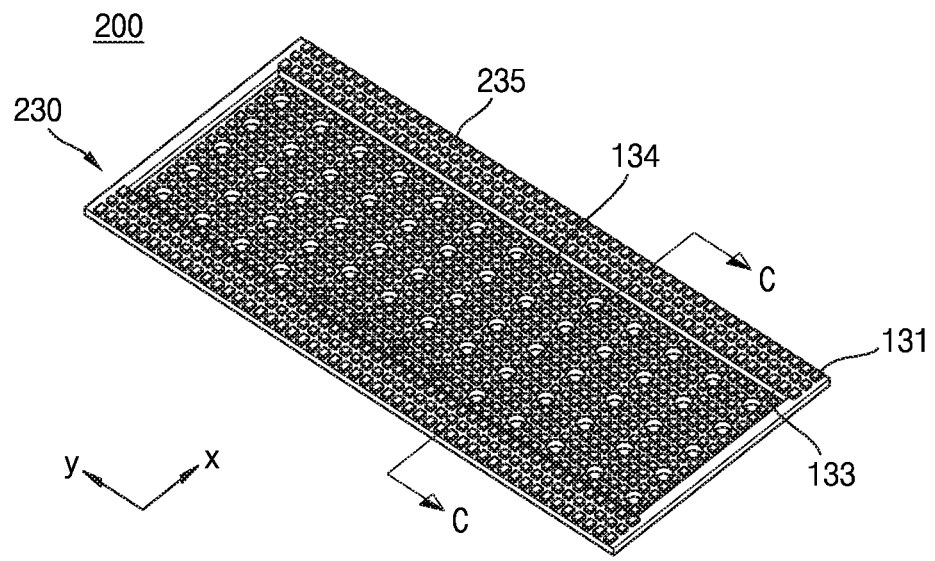
FIG. 6 is a perspective view of an upper dumbbell of a stack tool according to some example embodiments of inventive concepts.
Figure 7:
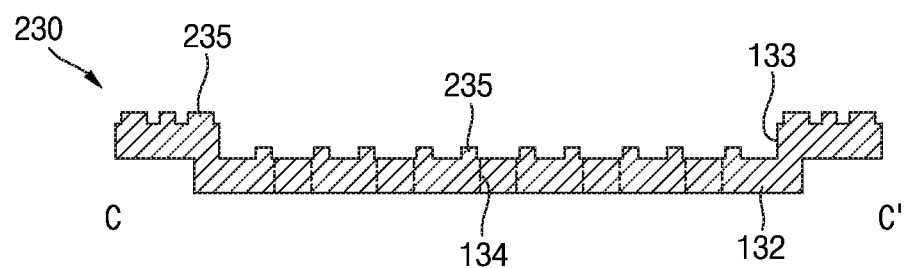
FIG. 7 is a vertical cross-sectional view taken along the line C-C of FIG. 6.

FIG. 6 is a perspective view of an upper dumbbell of a stack tool according to some example embodiments of inventive concepts. FIG. 7 is a vertical cross-sectional view taken along line C-C of FIG. 6.

Referring to FIGS. 2 to 7, a stack tool 200 according to some example embodiments of inventive concepts may be formed to include the lower jig 110, the intermediate jig 120, and an upper dumbbell 230. The upper dumbbell 230 of stack tool 200 according to some example embodiments of inventive concepts has a structure different from the stack tool 100 according to FIGS. 2 to 5. Accordingly, the stack tool 200 according to some example embodiments of inventive concepts will be described below based on the upper dumbbell 230. Further, components of the stack tool 200, which are similar to or the same as those of the stack tool 100 according to FIGS. 2 to 5, will be given the same reference numerals and detailed descriptions thereof will be omitted.

The upper dumbbell 230 may include the dumbbell main body 131, the protruding support 132, the upper recess 133, the upper through-hole 134, and an upper protrusion 235.

The upper protrusion 235 may be formed in a polygonal pillar shape such as a triangular pillar shape, a square pillar shape, or a hexagonal pillar shape. Further, the upper protrusion 235 may be formed in a cylindrical shape. The upper protrusion 235 may be formed in a polygonal horn shape such as a triangular horn shape, a square horn shape, or a hexagonal horn shape. The upper protrusion 235 may be formed in a conical shape. A plurality of upper protrusions 235 may be formed and spaced apart from each other on the entirety of a region including the upper surface of the dumbbell main body 131 and the bottom surface of the upper recess 133. Each of the plurality of upper protrusions 235 may be formed to have a height lower than the depth of the upper recess 133. The plurality of upper protrusions 235 may be formed to be the same size or at least a portion of the plurality of upper protrusions 235 may be formed in different sizes. Here, the size may refer to a width or a height based on a square pillar.

The plurality of upper protrusions 235 may increase a surface area of the upper surface of the upper dumbbell 230 to improve a heat dissipation characteristic of the upper dumbbell 230. Thus, in the cooling process performed after the reflow process is finished, the upper dumbbell 230 may be more rapidly cooled.

A stack tool according to some example embodiments of inventive concepts will be described below.

Figure 8:
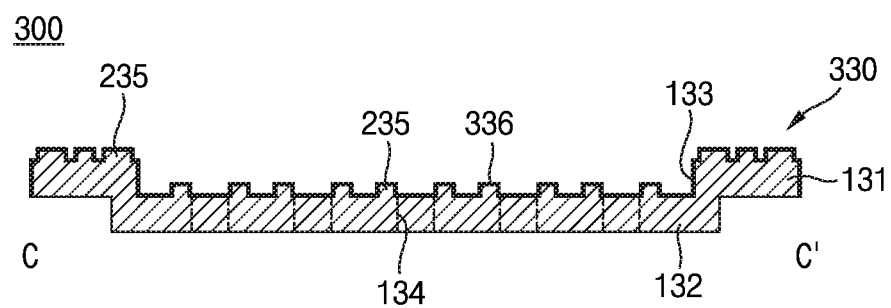

FIG. 8 is a vertical cross-sectional view, corresponding to FIG. 7, of an upper dumbbell of a stack tool according to some example embodiments of inventive concepts.

Referring to FIGS. 2 to 8, a stack tool 300 according to some example embodiments of inventive concepts may be formed to include the lower jig 110, the intermediate jig 120, and an upper dumbbell 330.

The upper dumbbell 330 may include the dumbbell main body 131, the protruding support 132, the upper recess 133, the upper through-hole 134, the upper protrusion 235, and an upper coating layer 336.

The upper coating layer 336 may be formed of a material, such as graphene or a carbon nanotube, having high thermal conductivity. The upper coating layer 336 may be formed in the entirety of a region including the upper surface of the dumbbell main body 131, the bottom surface of the upper recess 133, and a surface of the upper protrusion 235. Since the upper coating layer 336 is formed of graphene or a carbon nanotube, a surface area of an upper surface of the upper dumbbell 330 may be increased but a heat transfer characteristic may not be degraded. The upper coating layer 336 may increase the surface area of the upper surface of the upper dumbbell 330 to improve a heat dissipation characteristic of the upper dumbbell 330. Thus, in the cooling process performed after the reflow process is terminated, the upper dumbbell 330 may be more rapidly cooled.

A reflow apparatus according to some example embodiments of inventive concepts will be described below.

Figure 9:
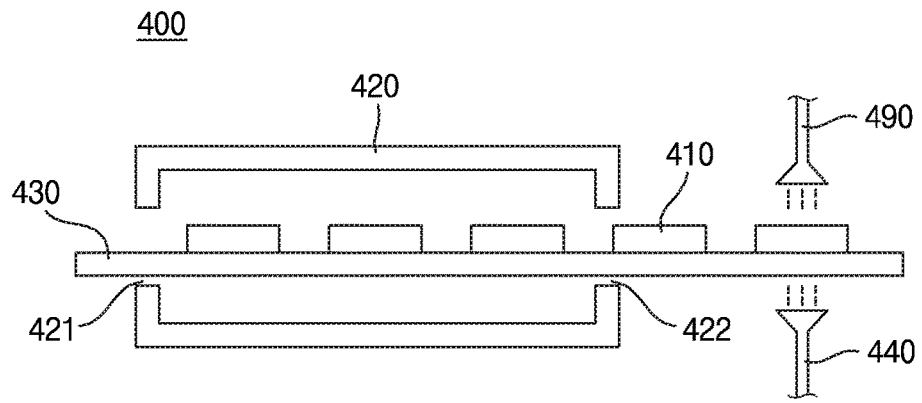
FIG. 9 is a vertical cross-sectional view of a reflow apparatus according to some example embodiments of inventive concepts.
Figure 10:
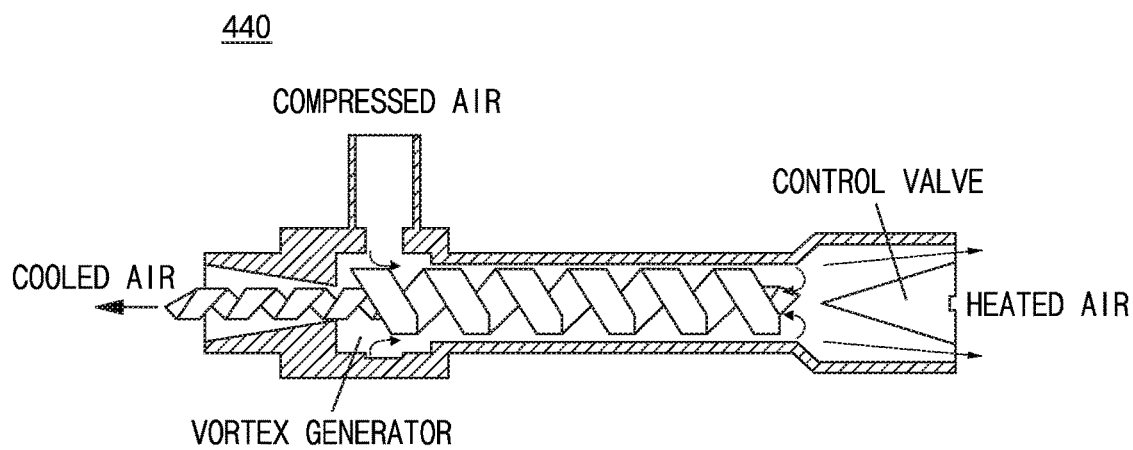
FIG. 10 is a vertical cross-sectional view of a vortex tube which is used in the reflow apparatus of FIG. 9.

FIG. 9 is a vertical cross-sectional view of a reflow apparatus according to some example embodiments of inventive concepts. FIG. 10 is a vertical cross-sectional view of a vortex tube which is used in the reflow apparatus of FIG. 9.

Referring to FIG. 9, a reflow apparatus 400 according to some example embodiments of inventive concepts may be formed to include a stack tool 410, a process chamber 420, a transfer part 430, and a cooling part 440. The reflow apparatus 400 may seat the stack tool 410 including the semiconductor package 10 mounted thereon on the transfer part 430 and may transfer the stack tool 410 to the process chamber 420. The reflow apparatus 400 may make the stack tool 410 perform reflow inside the process chamber 420, transfer the stack tool 410 out of the process chamber 420, and cool the stack tool 410 using the cooling part 440. The reflow apparatus 400 may separate the upper dumbbell 130 from the stack tool 410 and may take out and transfers the semiconductor package 10 to a subsequent process. The reflow apparatus 400 may cool the stack tool 410 transferred out of the process chamber 420 within a desired (or, alternatively, predetermined) amount of time to prevent, or reduce the likelihood of occurrence of, damage or deformation of the semiconductor package 10 when the upper dumbbell 130 is separated from the stack tool 410. For example, when the upper dumbbell 130 is separated from the stack tool 410, the reflow apparatus 400 prevents, or reduces the likelihood of occurrence of, the intermediate package substrate 13 of the semiconductor package 10 from being separated together with the upper dumbbell 130 or prevents, or reduces the likelihood of occurrence of, deformation of the intermediate package substrate 13.

The stack tool 410 is a part configured for mounting the semiconductor package 10 therein and transferring the semiconductor package 10 during the reflow process. The stack tool 410 may be formed of one of the stack tools according to the embodiments of FIGS. 2 to 8. The stack tool 410 may be formed to be cooled within a desired (or, alternatively, predetermined) amount of time to a temperature required for separating the upper dumbbell 130. Here, the amount of time may be an allowable amount of time required for performing a subsequent process after the reflow process. For example, the time may be an allowable amount of time required for, after the reflow process is finished, separating the upper dumbbell 130 from the stack tool 410 and separating the semiconductor package 10 from the stack tool 410 to transfer the semiconductor package 10 to a subsequent process.

The process chamber 420 may have a hollow interior and may include a tool inlet 421 and a tool outlet 422 provided at one side and the other side of the process chamber 420. The process chamber 420 may provide a space for performing the reflow process of the stack tool 410 which is transferred into the process chamber 420. The process chamber 420 may be formed to have an appropriate inner space according to a size of the stack tool 410 and the number thereof which are transferred into the process chamber 420. Although not shown in detail in the drawings, the process chamber 420 may include an air inlet configured to inject heated air into the interior of the process chamber 420 or a heating part (not shown) inside the process chamber 420 and configured to heat air. Further, the process chamber 420 may include a flowing part (not shown) configured to cause heated air therein to flow into the process chamber 420 to uniformly maintain a temperature inside. The process chamber 420 may be formed with a general chamber used in the reflow apparatus 400.

The transfer part 430 may be formed to pass through from the outside of the process chamber 420 to the tool inlet 421 and the tool outlet 422 of the process chamber 420. The transfer part 430 may be formed with a pair of pulleys and a belt wound on the pair of pulleys. The transfer part 430 may be formed with a chain type conveyor belt. The transfer part 430 may form a caterpillar. The transfer part 430 transfers the stack tool 410 into the process chamber 420 through the tool inlet 421 and then transfers the stack tool 410 out of the process chamber 420 through the tool outlet 422 after the reflow process. The transfer part 430 may transfer the stack tool 410 from the outside of the process chamber 420 to the cooling part 440.

The cooling part 440 may be formed with a part configured to spray a gas to cool the stack tool 410. The cooling part 440 may spray an inert gas such as air or nitrogen. The cooling part 440 may spray a gas cooled under room temperature. The cooling part 440 may be formed with a general part configured to spray a gas. For example, the cooling part 440 may include a spray nozzle and a gas supply line. Referring to FIG. 10, the cooling part 440 may be formed to include a vortex tube instead of the spray nozzle. A vortex tube is a device configured to spray cooled air using compressed air. When the cooling part 440 is formed with the vortex tube, the cooling part 440 may not have a separate part configured to cool a gas. The cooling part 440 may be behind the tool outlet 422 of the process chamber 420 and may, to cool the upper portion of the stack tool 410, provide a gas to an upper portion of the stack tool 410 transferred by the transfer part 430. The cooling part 440 may spray a gas to the upper dumbbell 130 of the stack tool 410 to cool the upper dumbbell 130.

Figure 11:
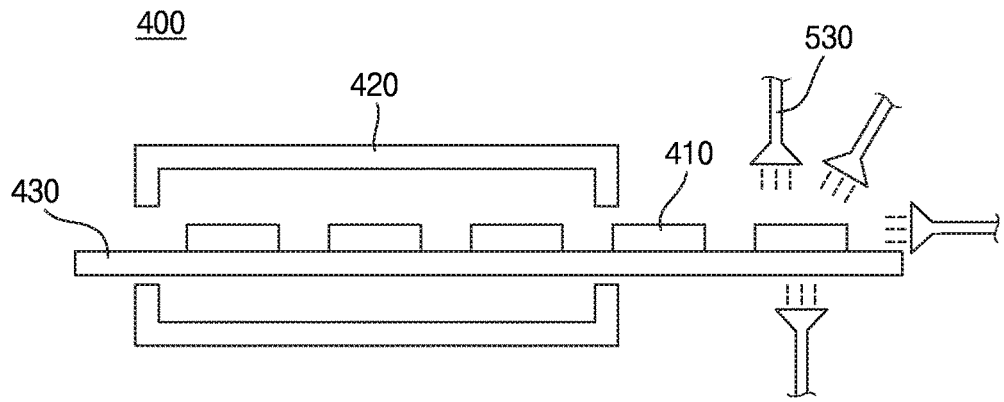
FIG. 11 is a vertical cross-sectional view of a reflow apparatus according to some example embodiments of inventive concepts.

Referring to FIG. 11, the cooling part 440 may be formed to spray a gas in a direction toward at least one of a front side, a pair of lateral sides, and a lower side of the transfer part 430 in addition to an upper side direction of the transfer part 430. A plurality of cooling parts 440 may be to spray a gas such that the stack tool 410 may be more effectively cooled. The cooling part 440 may bring a gas into surface contact with the stack tool 410 to more efficiently cool the stack tool 410.

A cooling efficiency evaluation result of the stack tool according to the example embodiments of inventive concepts will be described below.

Figure 12:
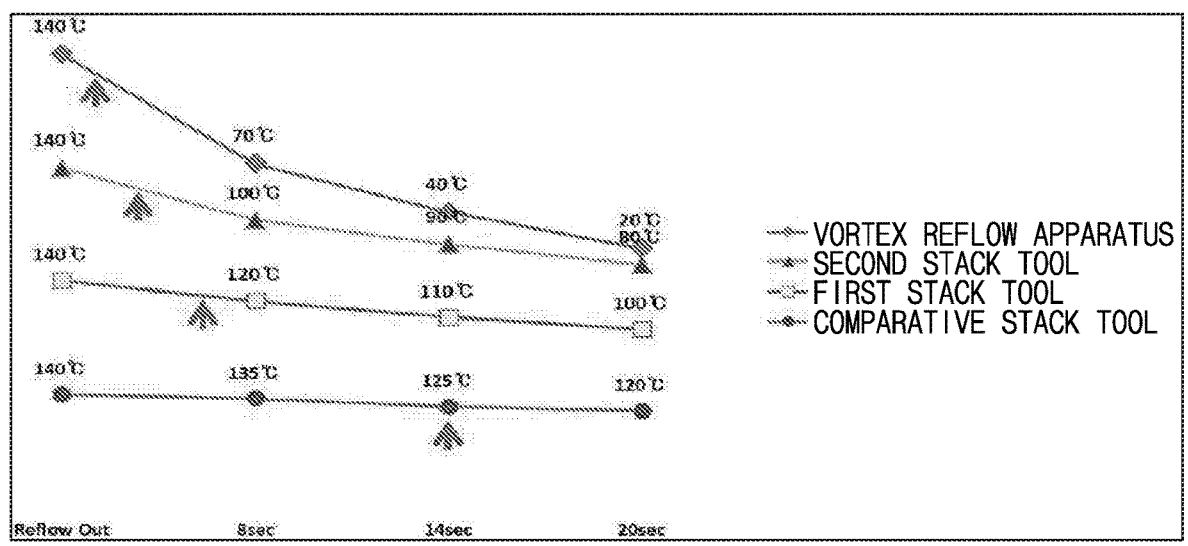
FIG. 12 is a graph showing measured cooling efficiency of the stack tools according to some example embodiments of inventive concepts.

FIG. 12 is a graph showing measured cooling efficiency of the stack tools according to the example embodiments of inventive concepts.

In this evaluation, the stack tool of FIG. 6 (hereinafter referred to as a "first stack tool") and the stack tool of FIG. 8 (hereinafter referred to as a "second stack tool") were used as evaluation targets, and a general stack tool in which an upper recess is not formed (hereinafter referred to as a "comparative stack tool") was used as a comparison target. Further, in this evaluation, the reflow apparatus using the vortex tube as a cooling part (hereinafter referred to as a "vortex reflow apparatus") was evaluated. A semiconductor package having a structure in which the package substrate is stacked on top of the lower semiconductor package was used.

In this evaluation, the stack tool, which was heated to a temperature of 140° C. in the process chamber, was transferred out of the process chamber, and then a degree of temperature drop was measured at each time point to evaluate cooling efficiency of the stack tool. The stack tool was used in a state in which it accommodated the semiconductor package. To separate the upper dumbbell of the stack tool without damage to the semiconductor package in the reflow process, the stack tool was cooled to a temperature of 125° C. or less. Solder balls used in the semiconductor package may, according to the compositions and manufacturers of the solder balls, slightly differ in solidification temperature after the solder balls are melted in the reflow process. For example, solidification of most of the solder balls finishes at a temperature of about 150° C., but solidification of some solder balls may finish at a temperature of 133° C. When the solidification temperature of the solder ball is a temperature of 133° C., it is required for the stack tool to be cooled to a temperature of 125° C. or less. When the upper dumbbell is separated in a state in which the stack tool has not been sufficiently cooled, the intermediate package substrate may be separated together with the upper dumbbell or the package substrate may become deformed. Further, subsequent processes may not be affected when the stack tool is cooled to a temperature of 125° C. or less within about 8 seconds in the reflow process.

Referring to FIG. 12, it can be seen that the first stack tool was cooled to a temperature of 125° C. approximately 6 seconds after being transferred out of the process chamber, and the second stack tool was cooled to a temperature of 125° C. approximately 4 seconds after being transferred out of the process chamber. The first stack tool and the second stack tool were cooled to the temperature of 125° C. within the desired 8 seconds, and the upper dumbbell was able to be separated without damage to the semiconductor package. On the other hand, it can be seen that the comparative stack was cooled to a temperature of 125° C. after 14 seconds. Therefore, in the comparative stack tool, the upper dumbbell can be separated after 14 seconds, and thus a problem of increased process time occurs. Meanwhile, the vortex reflow apparatus allows the upper dumbbell to be separated after 2 seconds.

According to the example embodiments of inventive concepts, heat dissipation efficiency of an upper dumbbell increases to rapidly cool an intermediate package substrate such that separation of the intermediate package substrate or deformation of the intermediate package substrate from the semiconductor chip can be prevented, or reduce the likelihood of occurrence, and reliability of a semiconductor package can be increased.

Further, according to the exemplary embodiments of inventive concepts, time required for separating the upper dumbbell from the intermediate package substrate is reduced such that time required for a reflow process can be reduced and production efficiency can be improved.

FIGS. 13a-13d are cross-sectional views showing various shapes of the upper recess 133.

Figure 13A:
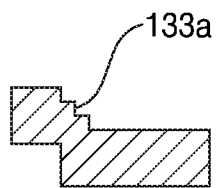
FIGS. 13a-13d are vertical cross-sectional views of shapes of an upper recess, according to some example embodiments.
Figure 13B:
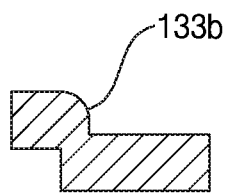
Figure 13C:
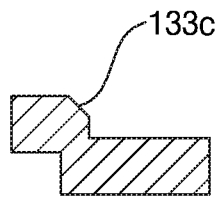
Figure 13D:
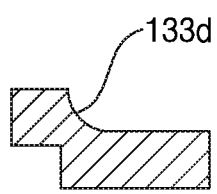

For example, as shown in FIG. 13a, the upper recess 133 may be in the shape of a plurality of steps and eaves 133a. Additionally, as shown in FIG. 13b, the upper recess 133 may be in the shape of a bevel 133b. Additionally, as shown in FIG. 13c, the upper recess 133 may be in the shape of a chamfer 133c. Additionally, as shown in FIG. 13d, the upper recess 133 may be in a curved shape 133d. However, inventive concepts are not limited thereto.

While the embodiments of inventive concepts have been described with reference to the accompanying drawings, those skilled in the art to which inventive concepts pertains can understand that inventive concepts may be implemented in other specific forms without departing from the technical spirit or the necessary features of inventive concepts. Therefore, it should be understood that the above-described embodiments are not restrictive but illustrative in all aspects.

What is claimed is:

1. A stack tool comprising:
a lower jig having a plurality of package seating regions configured to seat a semiconductor package;
an intermediate jig configured to be seated on top of the lower jig, and having a package support hole into which the semiconductor package is configured to be inserted and which has a shape corresponding to the plurality of package seating regions; and
an upper dumbbell including,
a dumbbell main body on top of the intermediate jig,
an upper recess stepped downward from an upper surface of the dumbbell main body on only a region corresponding to an upper surface of the semiconductor package, and
a protruding support configured to protrude downward from a lower surface of the upper recess and configured to be brought into contact with an upper surface of the semiconductor package.

2. The stack tool of claim 1, wherein the dumbbell main body is integral with the protruding support.

3. The stack tool of claim 1, wherein,
the protruding support is configured to be in direct contact with an upper surface of an intermediate package substrate, the intermediate package substrate being soldered to a lower semiconductor package.

4. The stack tool of claim 1, wherein the upper recess is formed at a single position in a first region corresponding to the upper surface of the semiconductor package.

5. The stack tool of claim 1, wherein a depth of the upper recess is less than a thickness of the dumbbell main body.

6. The stack tool of claim 1, wherein the upper dumbbell has an upper coating layer formed in a second region, the second region including the upper surface of the dumbbell main body and a bottom surface of the upper recess.

7. The stack tool of claim 6, wherein the upper coating layer includes at least one of graphene and a carbon nanotube.

8. The stack tool of claim 1, wherein the upper dumbbell further includes a plurality of upper protrusions spaced apart from each other in a second region, the second region including the upper surface of the dumbbell main body and a surface of the upper recess.

9. The stack tool of claim 8, wherein a shape of each of the plurality of upper protrusions is one of a triangular pillar, a quadrangular pillar, a hexagonal pillar, a cylindrical pillar, a triangular horn, a quadrangular horn, a hexagonal horn, or a conical horn.

10. The stack tool of claim 1, wherein the upper dumbbell includes an upper coating layer on each of the upper surface of the dumbbell main body, a surface of the upper recess, and a surface of an upper protrusion.

11. The stack tool of claim 10, wherein the upper coating layer includes at least one of graphene and a carbon nanotube.

12. The stack tool of claim 1, wherein,
the upper dumbbell further includes an upper through-hole passing from a bottom surface of the upper recess to a lower surface of the protruding support, and
the upper through-hole is in a shape of an upside-down frustum.

13. A stack tool comprising:
a lower jig having a plurality of package seating regions configured to seat a semiconductor package;
an intermediate jig having a package support hole configured to support the semiconductor package and having a shape corresponding to each of the plurality of package seating regions; and
an upper dumbbell on top of the intermediate jig, the upper dumbbell including,
a dumbbell main body, the dumbbell main body having a first region corresponding to an upper surface of the semiconductor package, the first region having a volume less than each of the plurality of package seating regions, wherein
a portion of a bottom surface of the upper dumbbell is configured to contact a portion of a top surface of the intermediate jig.

14. A stack tool comprising:
a lower jig having a plurality of package seating regions configured to seat a semiconductor package;
an intermediate jig having a package support hole configured to support the semiconductor package and having a shape corresponding to each of the plurality of package seating regions; and
an upper dumbbell on top of the intermediate jig, the upper dumbbell including,
a dumbbell main body, the dumbbell main body having a first region corresponding to an upper surface of the semiconductor package, the first region having a volume less than each of the plurality of package seating regions
wherein the dumbbell main body includes an upper recess in a recess shape stepped down from an upper surface of the dumbbell main body, the upper recess being in a second region, the second region corresponding to the upper surface of the semiconductor package.

15. The stack tool of claim 14, wherein the upper dumbbell further includes, a plurality of upper protrusions spaced apart from each other in a third region, the third region including the upper surface of the dumbbell main body and surface of the upper recess.

16. The stack tool of claim 15, wherein the upper dumbbell further includes an upper coating layer on each of the upper surface of the dumbbell main body, a surface of the upper recess, and a surface of an upper protrusion.

17. A reflow apparatus comprising:
the stack tool of claim 1;
a process chamber having a tool inlet at one side of the process chamber and a tool outlet at another side of the process chamber, the process chamber configured to provide a space for performing a reflow process on the stack tool; and
a transfer part configured to transfer the stack tool into the process chamber through the tool inlet and transfer the stack tool out of the process chamber through the tool outlet.

18. The reflow apparatus of claim 17, wherein the reflow apparatus further includes,
a cooling part outside the tool outlet and configured to spray a cooling gas onto the stack tool.

19. The reflow apparatus of claim 18, wherein the cooling part includes a vortex tube.

20. The reflow apparatus of claim 18, wherein the cooling part is configured to further spray a gas in a direction toward at least one of a front side, a pair of lateral sides, and a lower side of the stack tool.

* * * * *